United States Patent
Schmitz et al.

(10) Patent No.: US 11,361,233 B2
(45) Date of Patent: Jun. 14, 2022

(54) ESTIMATING FATIGUE LIFE OF TECHNICAL SYSTEMS

(71) Applicants: Sebastian Schmitz, Berlin (DE); Sesha Gundavarapu, Bangalore (IN); Suhas Karkada Suresh, Bangalore (IN)

(72) Inventors: Sebastian Schmitz, Berlin (DE); Sesha Gundavarapu, Bangalore (IN); Suhas Karkada Suresh, Bangalore (IN)

(73) Assignee: SIEMENS ENERGY GLOBAL GMBH & CO. KG, Munich (DE)

( * ) Notice: Subject to any disclaimer, the term of this patent is extended or adjusted under 35 U.S.C. 154(b) by 948 days.

(21) Appl. No.: 16/110,534

(22) Filed: Aug. 23, 2018

(65) Prior Publication Data

US 2020/0065688 A1 Feb. 27, 2020

(51) Int. Cl.
*G06N 5/04* (2006.01)
*G06F 30/20* (2020.01)
*G06F 17/18* (2006.01)

(52) U.S. Cl.
CPC ............ *G06N 5/046* (2013.01); *G06F 17/18* (2013.01); *G06F 30/20* (2020.01)

(58) Field of Classification Search
CPC .......... G06N 5/046; G06F 17/18; G06F 30/20
See application file for complete search history.

(56) References Cited

U.S. PATENT DOCUMENTS

| | | | |
|---|---|---|---|
| 7,162,373 B1 * | 1/2007 | Kadioglu | F01D 21/003 702/35 |
| 8,290,753 B2 * | 10/2012 | Tryon, III | G06F 11/008 703/2 |

(Continued)

FOREIGN PATENT DOCUMENTS

WO   WO2015053949 A1   4/2015

OTHER PUBLICATIONS

International Search Report and the Written Opinion for International Patent Application PCT/EP2019/072593 dated Dec. 3, 2019.

(Continued)

*Primary Examiner* — Bryan Bui
(74) *Attorney, Agent, or Firm* — Lempia Summerfield Katz LLC

(57) ABSTRACT

A method, device, and system of estimation fatigue life of a technical system are disclosed. The method includes computing a lifing probability distribution for at least one component of the technical system based on material property scatter data and at least one damage scenario associated with the at least one component. Further, the method includes determining a time-damage accumulation for the at least one component by combining plurality of damage scenario and damage accumulation rules for the at least one component. Furthermore, the method includes determining a spatial-damage accumulation and a cumulative time-damage accumulation for each of a plurality of regions in the at least one component. The method also includes determining an integral damage including integral of the spatial-damage accumulation and the cumulative time-damage accumulation for the at least one component based on simulation of the at least one damage scenario and conditional probabilities for the at least one damage scenario. The fatigue life of the technical system is estimated by determining a probability of fatigue failure of the technical system by combining the integral damage and predicted damage scenarios for a plurality of components in the technical system based on the law of total probability.

16 Claims, 9 Drawing Sheets

(56) References Cited

U.S. PATENT DOCUMENTS

2015/0168262 A1 6/2015 Green
2017/0323040 A1 11/2017 Joinson et al.

OTHER PUBLICATIONS

Mäde, Lucas, et al. "Combined notch and size effect modeling in a local probabilistic approach for LCF," Computational Materials Science, vol. 142, pp. 377-388 (2018).
Schmitz, Sebastian, et al. "A Probabilistic Model for LCF," Computational Materials Science, vol. 79, pp. 584-590 (2013).

* cited by examiner

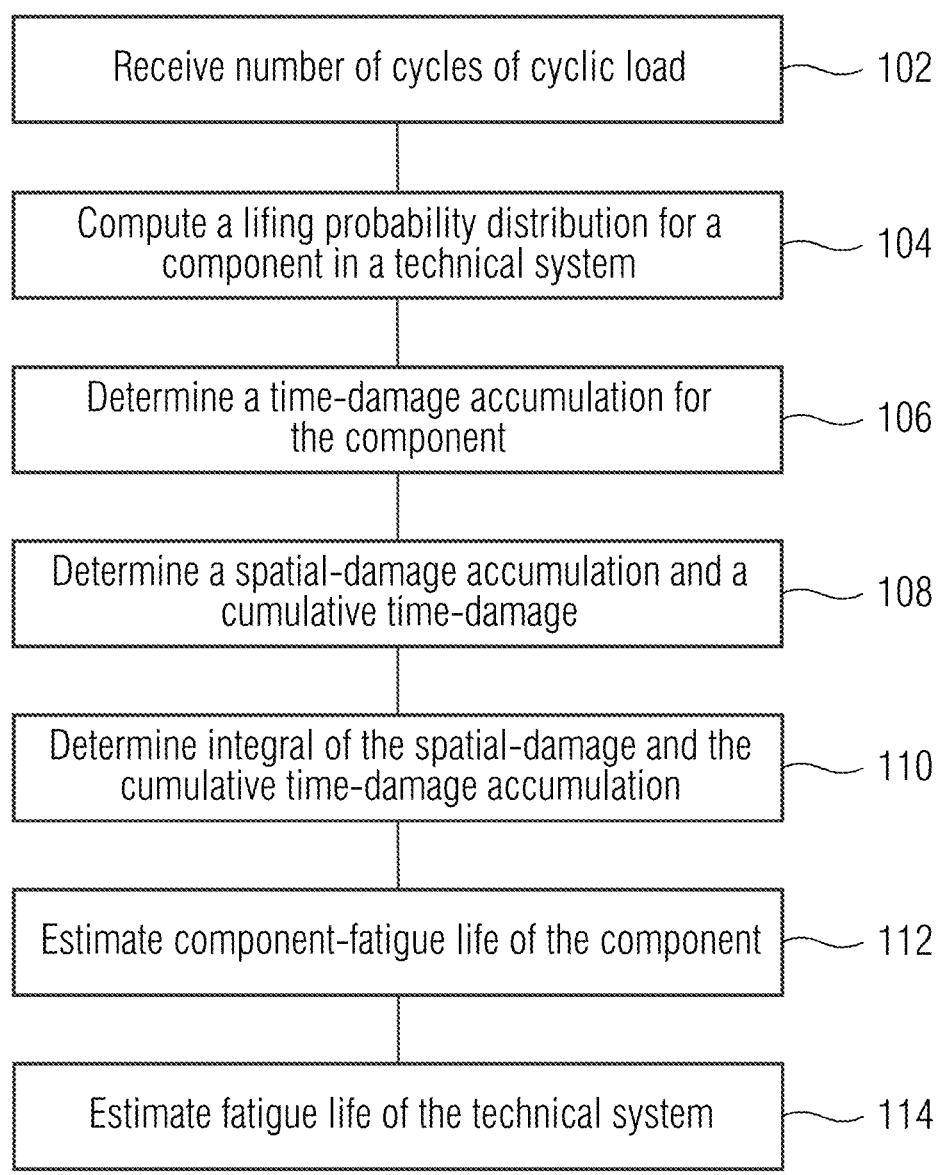

FIG 2

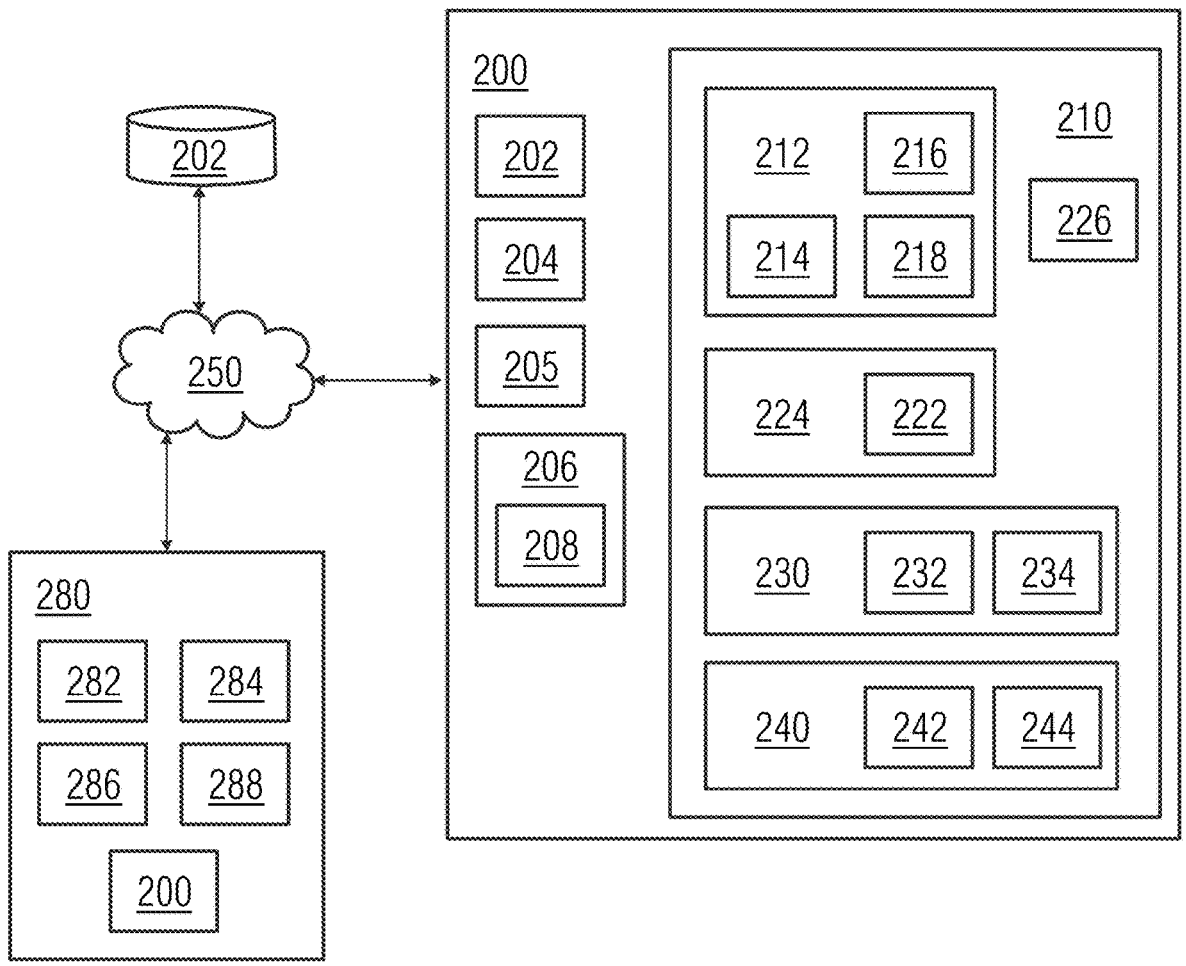

200 device
202 database
204 processor
205 communication unit
206 display unit
208 GUI (graphic user interface)
210 memory
212 material module
214 component module
216 scatter module
218 material distribution module
222 time module
224 cumulative time module
226 spatial module
230 damage module
232 damage-simulation module
234 condition module
240 life module
244 system life module
250 communication network
280 technical system
282-288 components 200 device
300 system
304 server
342 database
350 network interface
380 technical plant
380A-380N technical systems

FIG 7A
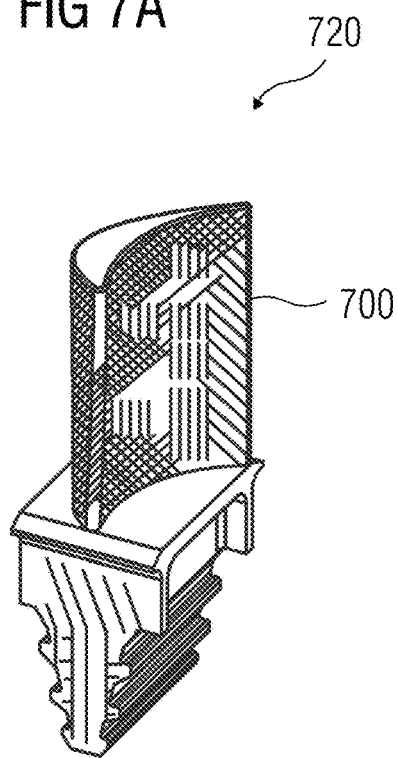
FIG 7B
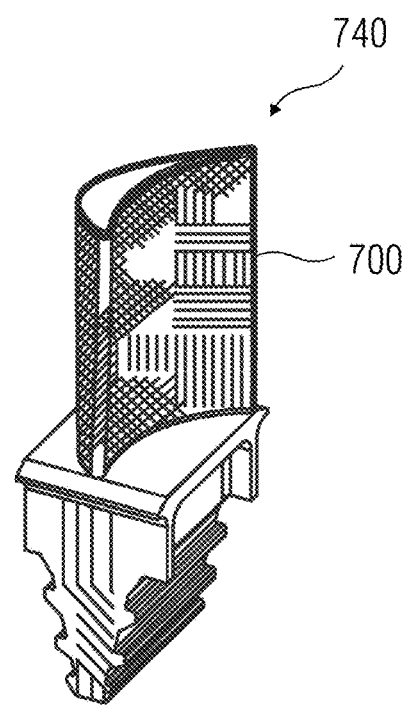
FIG 7C
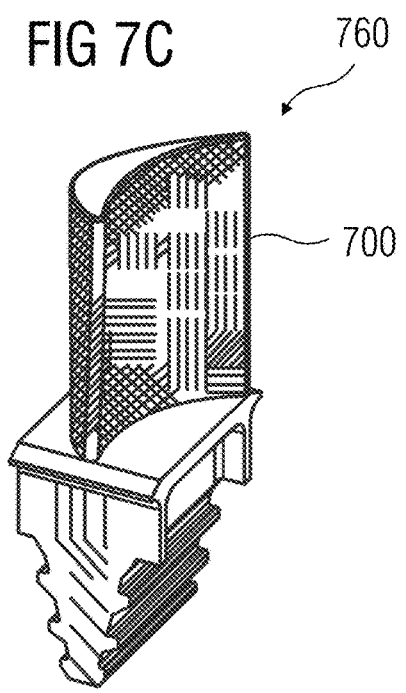
FIG 7D
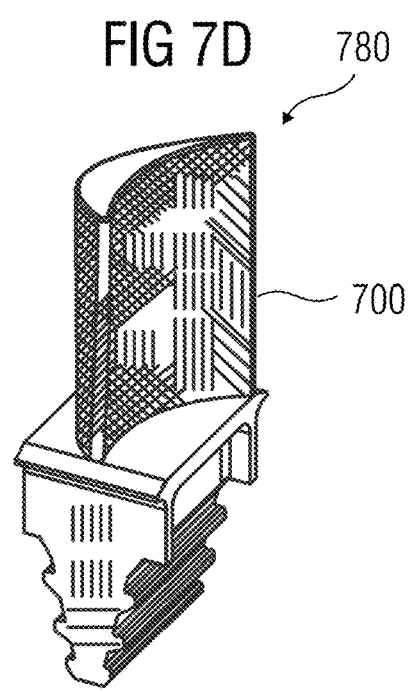
 720  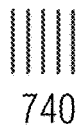 740  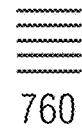 760  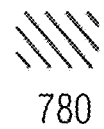 780

ESTIMATING FATIGUE LIFE OF TECHNICAL SYSTEMS

BACKGROUND

During operation, technical systems, (such as gas-turbine components, motors, large drives), are subjected to high thermal and mechanical loads. In case of cyclic loads, material of the technical systems may suffer from fatigue (e.g., low-cycle fatigue [LCF], high-cycle fatigue [HCF], or thermo-mechanical fatigue [TMF]).

Further, localized scatter in material properties the time until crack initiation is not the same for technical systems under same loading and boundary conditions. This may have a significant impact on the time until crack initiation. For example, spallation of thermal barrier coatings (TBC) on turbine blades may influence LCF failure of the blades. Therefore, fatigue in technical systems may limit the service life of the technical systems.

SUMMARY

This summary is provided to introduce a selection of concepts in a simplified form that are further disclosed in the detailed description. This summary is not intended to identify key or essential concepts of the claimed subject matter, nor is it intended for determining the scope of the claimed subject matter.

The scope of the present disclosure is defined solely by the appended claims and is not affected to any degree by the statements within this summary. The present embodiments may obviate one or more of the drawbacks or limitations in the related art.

In accordance with one aspect, there is provided a method for estimation of fatigue life of a technical system. The technical system is subject to cyclic loads. The technical system includes of a plurality of components. The method is described with respect to a component of the plurality of components. The method includes computing a lifing probability distribution for the component based on material property scatter data and damage scenarios associated with the component. The lifing probability distribution refers to probability for failure for a life number such as number of cycles.

The method also includes determining a time-damage accumulation (D_t) for the component by combining plurality of damage scenarios and damage accumulation rules for the component. Further, the method includes determining a spatial-damage accumulation (D_x) and a cumulative D_t for each of a plurality of regions in the component. Furthermore, the method includes determining an integral damage including integral of the D_x and the cumulative D_t for the component based on simulation of the damage scenarios and conditional probabilities for the damage scenarios. The method includes estimating fatigue life of the technical system by determining a probability of fatigue failure of the technical system by combining the integral damage and predicted damage scenarios for the plurality of components based on the law of total probability.

In accordance with another aspect, a device is provided for estimating fatigue life of a technical system subject to cyclic loads. The technical system includes of a plurality of components. The device includes at least one processor and a memory communicatively coupled to the at least one processor. The memory includes a material module to compute a lifing probability distribution for a component based on material property scatter data and damage scenarios associated with the component. The memory also includes a time module to determine a time-damage accumulation (D_t) for the component by combining plurality of damage scenarios and damage accumulation rules for the component. The memory includes a space module to determine a spatial-damage accumulation (D_x) and a cumulative D_t for each of a plurality of regions in the component. Further, the memory includes a damage module to determine an integral damage including integral of the D_x and the cumulative D_t for the at least one component based on simulation of the damage scenario and conditional probabilities for the damage scenarios. Further, the memory includes a life module to estimate fatigue life of the technical system by determining a probability of fatigue failure of the technical system by combining the integral damage for the plurality of components based on law of total probability.

In accordance with yet another aspect, a system for a technical plant is provided. The technical plant includes a plurality of technical systems, each subject to cyclic loads. The technical systems each include a component. The system includes a server operable on one of a cloud computing platform and an edge computing platform. The system also includes a network interface communicatively coupled to the server and a device for each of the technical systems. The device is capable of estimating fatigue life of each of the technical systems.

BRIEF DESCRIPTION OF THE DRAWINGS

The present disclosure is further described hereinafter with reference to illustrated embodiments shown in the accompanying drawings, in which:

FIG. 1 illustrates a method for estimation of fatigue life of a technical system, according to an embodiment.

FIG. 2 is a block diagram of a device to estimate fatigue life of a technical system, according to an embodiment.

FIGS. 7A-7D illustrate spatial-damage accumulation on a turbine blade, according to an embodiment.

DETAILED DESCRIPTION

Figure 3:
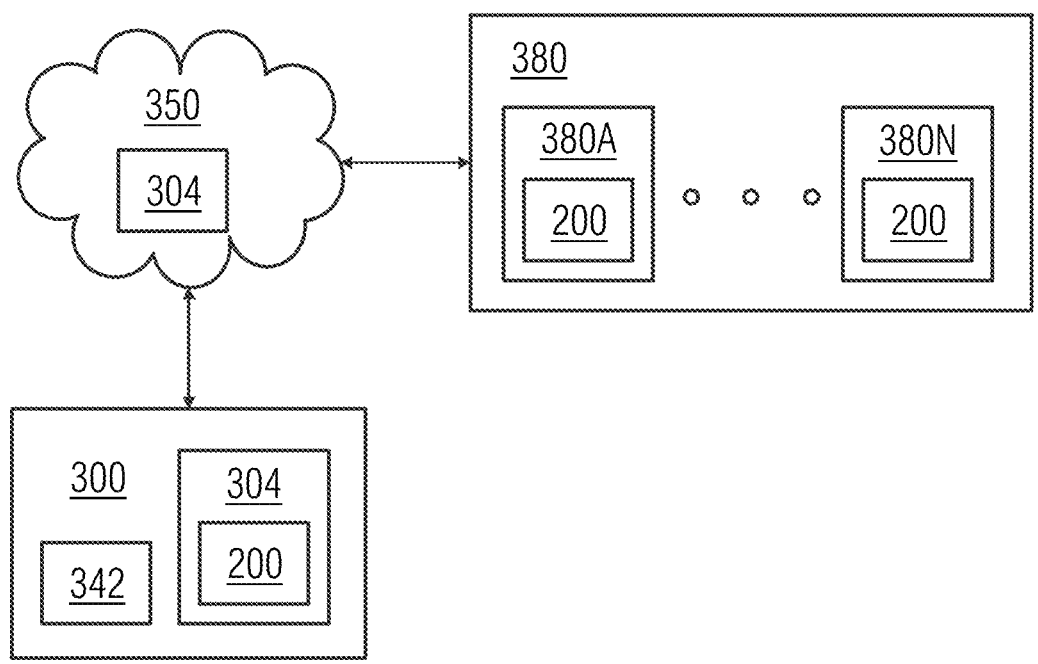
FIG. 3 is a block diagram of system for a technical plant, according to an embodiment.

Various embodiments are described with reference to the drawings, wherein like reference numerals are used to refer to like elements throughout. In the following description, turbine has been considered as an example of a technical system for the purpose of explanation. Further, numerous specific details are set forth in order to provide thorough understanding of one or more embodiments. These examples must not be considered to limit the application of the disclosure to turbines and includes any technical system such as motors, medical instruments, or any structure whose material life is to be estimated. It may be evident that such embodiments may be practiced without these specific details limiting the application to turbines.

The illustrated embodiments are particularly suitable for fatigue crack life estimation of forged rotor components of heavy duty industrial gas and steam turbines and generators. The present disclosure may also apply to other components of heavy duty industrial turbines such as blades, vanes, transitions, casing components, etc., as well as to diverse components, such as components of smaller industrial gas-turbines, aero-engines, aircraft, wind turbine parts such as blades, pressure vessels and piping, semiconductor electronics such as microchips, etc.

FIG. 1 illustrates a method for estimation of fatigue life of a technical system. The technical system includes one or more components, in which each component may be subject to one or more cyclic loads.

The method begins with act 102 at which the number of cycles of the cyclic load is received. In an embodiment, the number of cycles are computed based on material requirements of material of the technical system. Example material requirements include expected strength, predicted strain, predicted stress, etc.

At act 104, a lifing probability distribution of a component in the technical system is determined. The lifing probability distribution is based on material property scatter data and one or more damage scenarios associated with the component. Accordingly, the lifing probability distribution takes into account that the material of the component has inherent variation or scatter. Further, because the component is expected to experience damage, the damage scenarios are considered when determining lifing probability distribution.

Figure 9A:
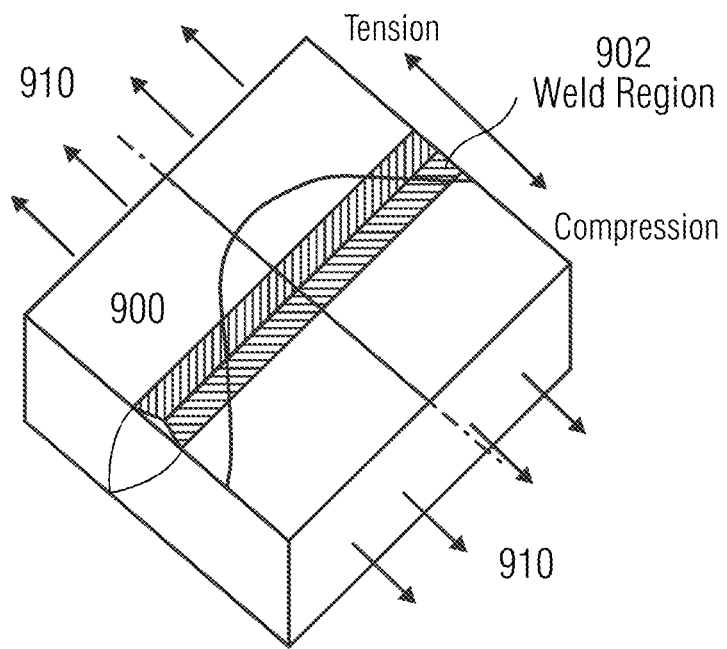
FIGS. 9A and 9B illustrate an application of the method in FIG. 1 to a welded structure, according to an embodiment.
Figure 9B:
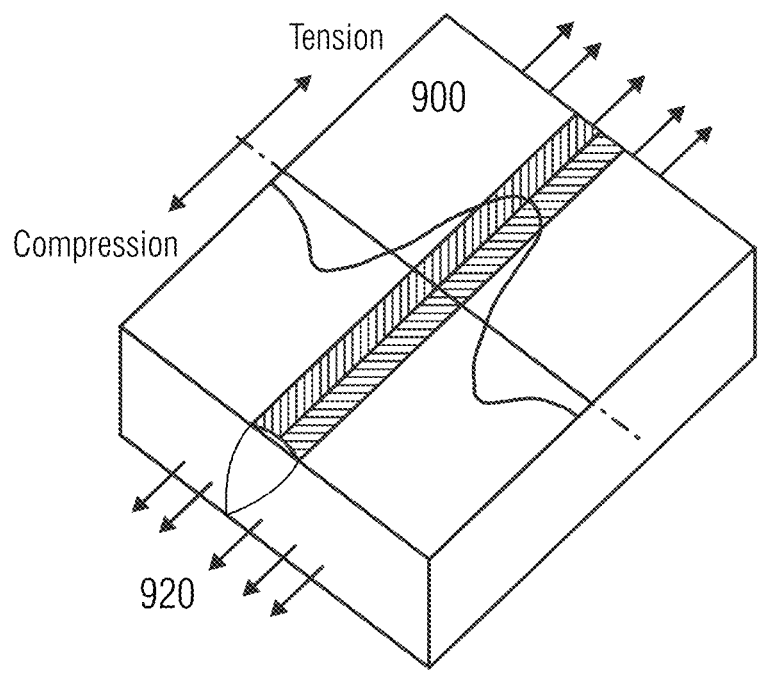

As used herein damage scenarios refer to the various conditions in which the component and its material may be damaged. For example, FIG. 7A-D illustrates damage scenarios on a turbine blade. Further, FIGS. 9A and 9B illustrate damage scenarios in a welded structure.

At act 106, a time-damage accumulation (D_t) for the component is determined by combining the damage scenarios and damage accumulation rules for the component. The time-damage accumulation refers to damage accumulation with respect to time dimension. The damage accumulation rules refer rules associated with physics and an operation profile of the technical system and the component. For example, if the component is a turbine blade in a turbine then the damage accumulation rules refer to boundary conditions of the turbine imposed by laws of physics and load applied on the turbine.

At act 108, a spatial-damage accumulation (D_x) and a cumulative D_t is determined for each of a plurality of regions in the component. The spatial-damage accumulation refers to damage accumulation with respect to space dimension. D-x is based on a probability distribution with respect to spatial events in time and the damage scenarios. The spatial events refer to events associated with each of the plurality of regions in the component. Considering the example of the turbine blade, the regions include leading edge, trailing edge, etc. The spatial events in the turbine blade refer to difference in stress, strain, etc. that is experienced in each region. For example, the leading edge in the turbine blade experiences higher stress and therefore exhibits different spatial event as compared to the trailing edge of the turbine blade. Due to scatter in the material and boundary conditions a region with least expected life is not necessarily the region with highest accumulated damage. Thus, damage accumulation over the plurality of regions is considered to estimate the fatigue life and remaining life of the component under cyclic load over its entire geometry embodiment.

The cumulative D_t is an integral of the time-damage accumulation D_t for the number of cycles received in act 102 for each of the plurality of regions. Therefore, D_t accounts for any damage due to cyclic loading, for example, damage associated with wear and tear over a period of time. In an embodiment, the cumulative D_t is determined using a damage model, such as Miner's rule.

At act 110, an integral of D_x and the cumulative D_t is determined and is referred to as integral damage. The integral damage is determined based on simulation of the damage scenarios and conditional probabilities for the damage scenarios. In an embodiment, the simulation of the damage scenarios is a numerical random simulation, such as Weibull distribution. The conditional probabilities refer to "if" and "when" conditions associated with the damage scenarios. In an embodiment, the conditional probabilities are generated by Monte Carlo simulations.

At act 112, a component-fatigue life of the component is estimated by determining a component-probability of failure. The component-probability of failure is determined by combining the integral damage and predicted damage scenarios of the component based on law of total probability. The predicted damage scenarios refer to simulation of the damage scenarios for the component. In an embodiment, the component-probability of failure (F(n)[q]) for the numerical random simulation (e.g., sample) of the damage scenarios q is determined as:

$$F(n)[q] = 1 - \exp\left(-\left(\frac{n}{\eta(n)}\right)^m\right)$$

where n is cycle number of the cyclic loads and where $$\eta(n) = \int_A ((D(n,x))^m dA)^{-1/m}$$

where $\eta(n)$ function of the cycles for D_x and D_t, D(n,x) is a function of D_t and m is a material parameter of the component with surface A.

where D(n,x) is determined as $$D(n, x) = \sum_{j=1}^{d} \frac{q_j(n, x)}{n_{jdet}(x)}$$

where $q_j(n, x)$ is contribution of a damage scenarios at an instant (j) until cycle n of the cyclic load for each of the regions (x) on the component, $n_{jdet}(x)$ is a fatigue crack initiation time for the damage scenarios.

At act 114, fatigue life of the technical system is estimated by determining a probability of fatigue failure of the technical system. The probability of fatigue failure is determined by combining integral damage for all components in the technical system based on the law of total probability. In other words, component-probability of failure for each component is determined and combined with probability of the damage scenarios. In an embodiment, the law of total probability is determined by $$F^{total} = \sum_q F(n)[q] * P[q]$$

where $F^{total}$ is the probability of fatigue failure of the technical system, q represents the numerical random simulation of the damage scenarios, F(n)[q] is the component-probability of failure for the numerical random simulation of the damage scenarios, and P[q] is probability of q (e.g., the numerical random simulation of the damage scenarios).

In an embodiment, a design expert defines the number of cycles n. The present method is capable of predicting the probability of fatigue failure of the technical system. The operation of the above mentioned method is explained with reference to a turbine blade in FIGS. 7A-7D. The method is not limited to turbine blades and may be applied to any component, such as rotor, coils, welded structures, etc.

In an embodiment where the component is a rotor, the method steps are as follows. A time-damage accumulation (D_t) for each of rotor regions is determined by combining rotor-damage scenarios and damage accumulation rules for the rotor. A spatial-damage accumulation (D_x) for the rotor regions for the damage scenarios is determined by determining a cumulative D_t for each of the rotor regions over number of cycles (n). As used herein "n" is number of the cyclic load applied on the rotor. The method includes integrating D_x for the rotor based on probability of fatigue failure for each of the rotor-damage scenarios. Further, the method includes estimating a rotor-fatigue life of the rotor by determining a probability of failure of the rotor based on D_x and D_t for each of the rotor-damage scenarios.

FIG. 2 is a block diagram of a device 200 to estimate fatigue life of a technical system 280 including one or more components 282-288. The device 200 is installed on and accessible by a user device, for example, a personal computing device, a workstation, a client device, a network enabled computing device, any other suitable computing equipment, and combinations of multiple pieces of computing equipment. The device 200 may also be provided on the technical system 280. The device disclosed herein is in operable communication with a database 202 over a communication network 250.

The database 202 is, for example, a structured query language (SQL) data store or a not only SQL (NoSQL) data store. In an embodiment of the database 202, the database 202 may also be a location on a file system directly accessible by the device 200. In another embodiment of the database 202, the database 202 is configured as cloud based database implemented in a cloud computing environment, where computing resources are delivered as a service over the network 250.

As used herein, "cloud computing environment" refers to a processing environment including configurable computing physical and logical resources, for example, networks, servers, storage, applications, services, etc., and data distributed over the network 250, for example, the internet. The cloud computing environment provides on-demand network access to a shared pool of the configurable computing physical and logical resources. The communication network 250 is, for example, a wired network, a wireless network, a communication network, or a network formed from any combination of these networks.

In an embodiment, the device 200 is downloadable and usable on the user device. In another embodiment, the device is configured as a web based platform, for example, a website hosted on a server or a network of servers. In another embodiment, the device is implemented in the cloud computing environment. The device is developed, for example, using Google App engine cloud infrastructure of Google Inc., Amazon Web Services® of Amazon Technologies, Inc., as disclosed hereinafter in FIG. 6. In an embodiment, the device is configured as a cloud computing based platform implemented as a service for analysing data.

The device disclosed includes a memory 210 and at least one processor 204 communicatively coupled to the memory 210. As used herein, "memory" refers to all computer readable media, for example, non-volatile media, volatile media, and transmission media except for a transitory, propagating signal. The memory is configured to store computer program instructions defined by modules, for example, 212, 222, 230, etc., of the device. The processor 204 is configured to execute the defined computer program instructions in the modules. Further, the processor 204 is configured to execute the instructions in the memory 210 simultaneously.

As illustrated in FIG. 2, the device includes a communication unit 205 including a receiver to receive the test data from the technical system and a display unit 206. Additionally, a user using the user device may access the device via a graphic user interface (GUI) 208. The GUI is, for example, an online web interface, a web based downloadable application interface, etc.

The modules in the memory 210 include a material module 212, a time module 222, a spatial module 226, a damage module 230, and a life module 240. The material module 212 includes a component module 214, a scatter module 216, and a material distribution module 218. The time module 222 includes a cumulative time module 224. The damage module 230 includes damage-simulation module 232 and condition module 234. The life module 240 includes a component life module 242 and a system life module 244. The operation of the modules is explained with reference to component 282. The implementation applied mutatis mutandis to the components 284, 286, and 288.

The material module 212 is configured to compute a lifing probability distribution for the component 282 based on material property scatter data. To compute the lifing probability distribution, the modules 214, 216, and 218 are employed.

The component module 214 generates a component model of the component 282. The component model is used to determine material properties associated with the component 282. The scatter module 216 determines material property scatter data. The material property scatter data refers to variation in the material property. The variation may be due to inherent properties of the material. In an embodiment, the scatter module includes a learning algorithm configured to automatically generate the material property scatter data. The learning algorithm may employ machine learning techniques that rely on expert information on the material of the component 282. The material distribution module 218 uses the material properties and the material property scatter data to determine the lifing probability distribution for the component 282.

The time module 222 determines a time-damage accumulation (D_t for the component 282 by combining damage scenarios and damage accumulation rules for the component 282. The time module 222 includes a cumulative time module 224. The cumulative time module determines a cumulative D_t for each region of the component 282. The spatial module 226 determines a spatial-damage accumulation (D_x) for each of the regions in the component 282.

The damage module 230 determines an integral damage for the component 282. The integral damage includes integral of D_x and the cumulative D_t. The damage module 230 includes the damage-simulation module 232 and the condition module 234 to simulate damage scenarios and determine conditional probabilities. The integral damage is determined based on the damage scenarios and the conditional probabilities.

The life module 240 estimates fatigue life of the technical system 280. Further, the life module 240 determines remaining life of the technical system 280. The component life module 242 estimates a component-fatigue life of the component 282. To estimate the component-fatigue life, the component life module 242 determines a component-probability of failure by combining the integral damage for the component 282 based on the law of total probability. In an embodiment, the component life module 242 determines remaining life of the component 282. The integral damage is determined for each of the components 284, 286, and 288 as disclosed above.

The system life module 244 the fatigue life of the technical system 280 by determining a probability of fatigue failure of the technical system 280. The system life module 244 combines the integral damage for the components 282-288 based on law of total probability.

FIG. 3 is a block diagram of system 300 for a technical plant 380. The system 300 includes a server 304 including the device 200. The system 300 also includes a network interface 350 communicatively coupled to the server 304 and technical plant 380 including technical systems 380A-380N. The server 304 includes the device 200 for estimating life of the technical systems 380A-380N of the technical plant.

In an embodiment, the technical plant 380 maybe located in a remote location while the server 304 is located on a cloud server for example, using Google App engine cloud infrastructure of Google Inc., Amazon Web Services® of Amazon Technologies, Inc., the Amazon elastic compute cloud EC2® web service of Amazon Technologies, Inc., the Google® Cloud platform of Google Inc., the Microsoft® Cloud platform of Microsoft Corporation, etc. In case the server 304 is a cloud server, the device 200 also is implemented in the cloud computing environment.

The system 300 also includes a database 342. The database may be a cloud database connected to the network interface 350. In an embodiment, the database is connected to the server 304. The database 342 includes information relating to operation of the technical plant including details of the conditions such as, material domain knowledge, test data associated with the material, physics model and mathematical model of the technical systems 380A-380N. For example, the database 342 may include model generator module to generate system models the technical systems based on system geometry and boundary conditions of the technical systems. As used herein the system geometry includes component geometry associated with components of the technical system and material geometry associated with the material. In another embodiment, the database 342 includes the damage module 230 in the device 200. Accordingly, simulation of the damage scenarios is performed on the server 304.

Figure 4:
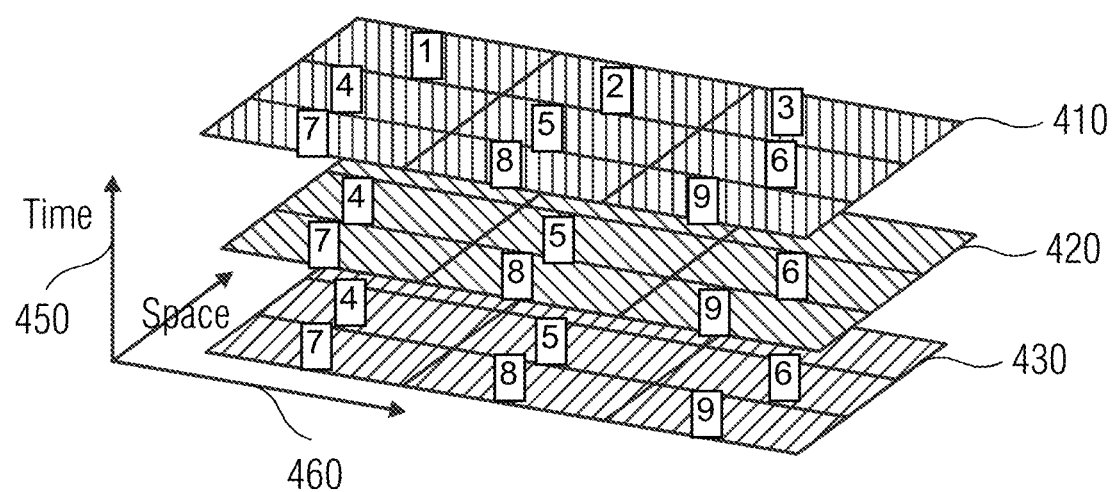
FIG. 4 illustrates a first exemplary scenario of damage accumulation over time for a material in a technical system.

FIG. 4 illustrates a first scenario of damage accumulation over time, e.g., a time-damage accumulation (D_t) for a material in a technical system. As depicted in FIG. 4, time 450 is indicated on y-axis and space 460 is indicated on x-axis. Space 460 in the material is depicted by the regions 1, 2, 3, 4, 5, 6, 7, 8, and 9. The change in time damage is indicated by varying legend of the time slices 410, 420, and 430. For example, at region 0 the damage accumulation changes with respect to the time slices 410, 420 and 430. The time-damage accumulation (D_t) is determined based on load time history and magnitude of alternating stress versus number of cycles to failure for the material.

In an embodiment, D_t is determined based on Miner's rule and is mathematically represented by the below equation:

$$D = \sum_{j=1}^{d} \frac{q_j}{n_{j_{det}}}$$

Where D is time damage, n is number of cycles to failure, $q_j$ is damage contribution of the damage stage j, $n_{j_{det}}$ is fatigue initiation time under damage stage j.

Figure 5:
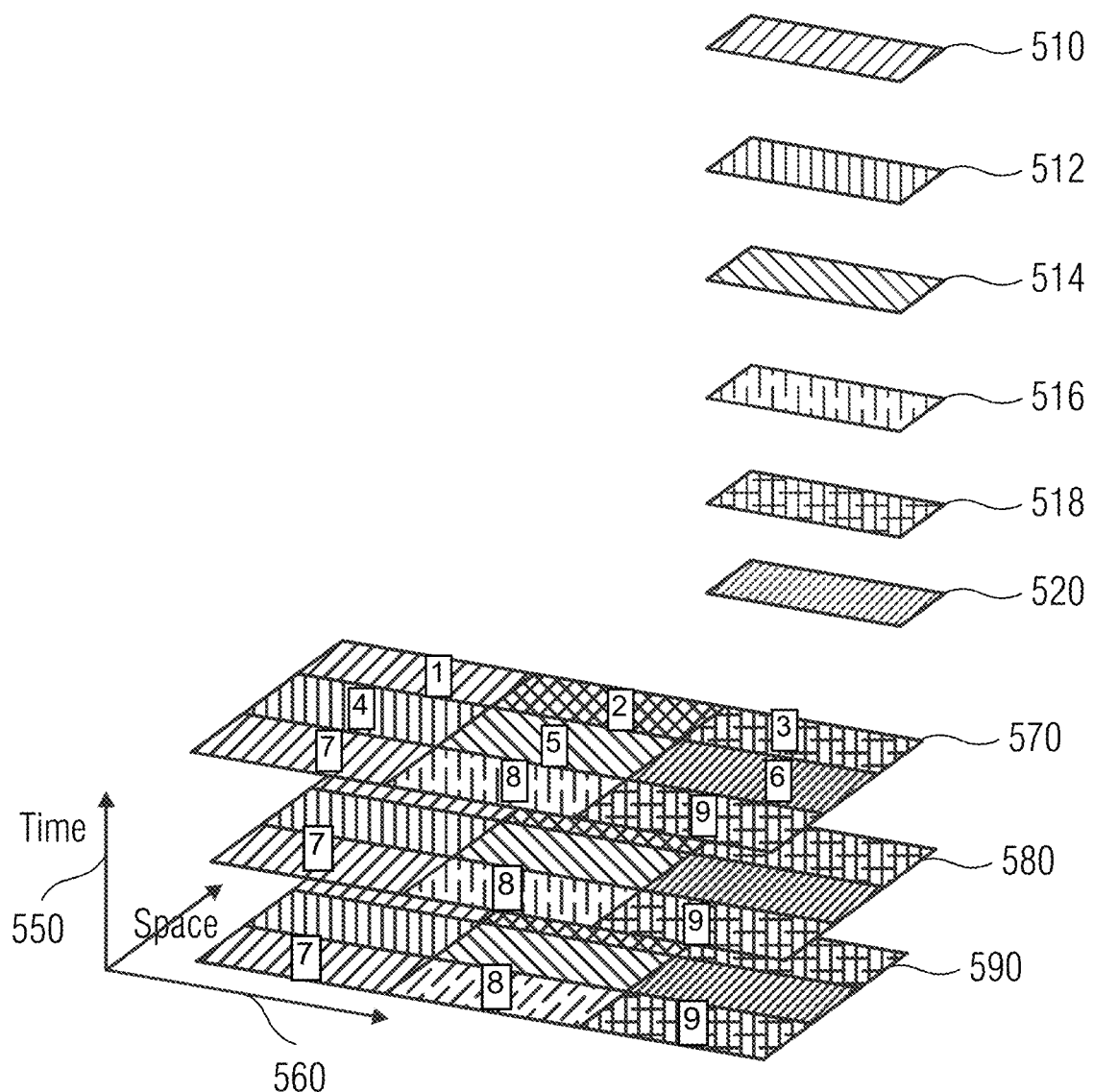
FIG. 5 illustrates a second exemplary scenario of spatial-damage accumulation for each region of the material in the technical system as used in FIG. 4.

FIG. 5 illustrates a second scenario of spatial-damage accumulation (D_x) for each region of the material. As depicted in FIG. 5, time 550 is indicated on y-axis and space 560 is indicated on x-axis. Variation in (D_x) for space 560 is depicted by the varying legends 510, 512, 514, 516, 518, and 520 for regions 1, 2, 3, 4, 5, 6, 7, 8, and 9. The legends 512 to 520 depict a constant behavior over time, across time slices 570, 580 and 590. The (D_x) is determined based on stress, load, temperature variation experienced at each the regions 1, 2, 3, 4, 5, 6, 7, 8, and 9 in the material.

Figure 6:
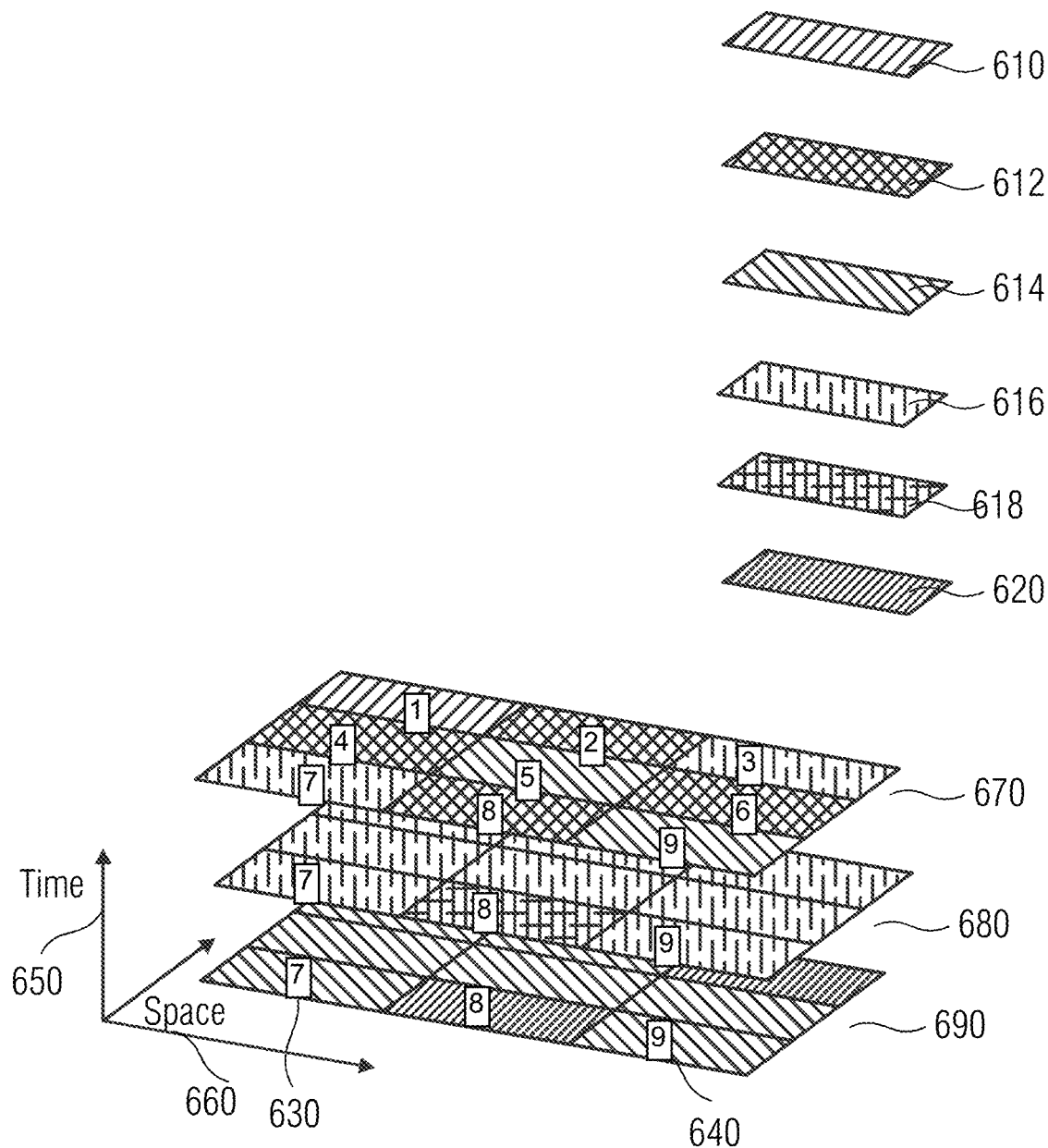
FIG. 6 illustrates a third exemplary scenario of damage accumulation over time and space for the material in the technical system as used in FIG. 4.

FIG. 6 illustrates a third scenario of damage accumulation over time and space. In other words, FIG. 6 illustrates integral of the D_x and cumulative D_t (also referred as integral damage). As depicted in FIG. 6, time 650 is indicated on y-axis and space 660 is indicated on x-axis. Varying legends 610, 612, 614, 616, 618, and 620 for regions 1, 2, 3, 4, 5, 6, 7, 8, and 9 illustrates integration of the spatial-damage accumulation in FIG. 5 and the time-damage accumulation in FIG. 4. For example, the integral damage regions 8 and 9 vary at each time slice 670, 680, and 690. In an embodiment, the region 7 (refer number 630) at time slice 690 and the region 9 (refer number 640) at time slice 690 have the same integral damage 614.

FIG. 7A-7D illustrates spatial-damage accumulation on a turbine blade 700. The blade 700 includes a blade base material and a Thermal Barrier Coating (TBC). The legends 702, 704, 706, and 708 refer to varying degrees/severity of spatial-damage accumulation across regions in the blade 700. For example, legend 702 indicates highest degree of the spatial-damage accumulation and 708 indicated lowest degree of the spatial-damage accumulation. In an embodiment, the spatial-damage accumulation indicated by the legends 702, 704, 706, and 708 refer to varying degrees/severity of spatial-damage to the TBC of the blade 700.

FIG. 7A illustrates varying spatial-damage accumulation at a time slice 720 across regions in the blade 700. In an embodiment, a surface integral of the spatial-damage accumulation on a surface of the turbine blade 700 is computed to determine fatigue life of the turbine blade 700.

FIGS. 7B, 7C, and 7D illustrate varying spatial-damage accumulation for time slices 740, 760, and 780 across the regions in the blade 700. The method disclosed in FIG. 1A is used to determine the fatigue life of the blade. In another embodiment, integration of the spatial-damage accumulation for the time slices 740, 760, and 780 is performed. The integration is performed for each region and for the surface of the turbine blade 700.

Figure 8:
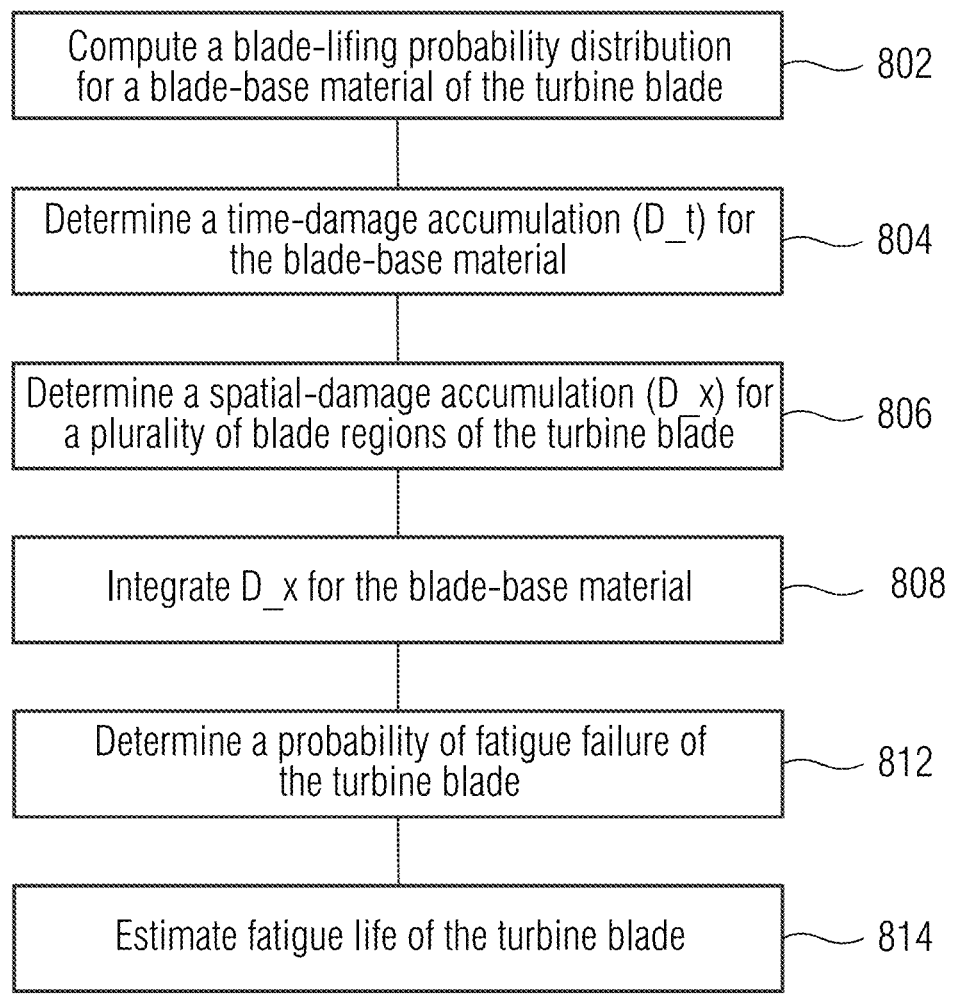
FIG. 8 illustrates an exemplary method for estimation of a blade-fatigue life of the turbine blade in FIGS. 7A-7D.

FIG. 8 illustrates a method 800 for estimation of a blade-fatigue life of the turbine blade 700. The method estimates a blade-fatigue life of the blade 700 based on a TBC-probability of failure and probability for base material fatigue failure. As used herein TBC-probability of failure refers to probability of failure of the TBC blade 700.

The method 800 begins with step 802 by computing a blade-lifing probability distribution for the blade base material of the blade 700. The blade-lifing probability distribution is on material property scatter data of the blade base material and one or more TBC damage scenarios. The TBC damage scenarios refer to multiple TBC scenarios where TBC maybe present or absent from the blade 700. For example, FIGS. 7A to 7D indicate absence of TBC through legend 708.

In an embodiment, the method 800 begins with generation of a blade model of the blade 700. The blade model includes blade geometry, physics and an operation profile of the blade 700. Multiple TBC damage scenarios may be simulated through the blade model.

At step 804, a time-damage accumulation (D_t) for the blade base material is determined. D_t is determined by combining the TBC damage scenarios and the damage accumulation rules for the blade 700. At step 806, a spatial-damage accumulation (D_x) for blade regions of the blade 700 is determined. D_x is determined for each of the TBC damage scenarios. In an embodiment, an integral of D_t is determined and combined with the TBC damage scenarios to determine D_x.

At step 808, D_x is integrated for the blade base material across the blade regions. The integrated D_x for the blade base material is determined based on numerical random simulation of TBC damage scenarios and conditional probabilities. In an embodiment, step 808 includes determination of the conditional probabilities. The conditional probabilities are determined for a TBC life for the TBC based on the TBC probability of failure. The TBC probability of failure is determined based on TBC material property scatter data, physics and an operation profile of the blade 700. The conditional probabilities are further determined based on conditional damage for the TBC damage scenarios. In addition, a cycle number of cyclic load on the blade 700 is received for an instant. The cycle number is based on the TBC life associated with the TBC damage scenarios.

At step 812, a probability of fatigue failure of the blade 700 is determined. The probability is determined based on the law of total probability. At step 814, a fatigue life of the blade 700 is determined based on the probability of fatigue failure of the blade.

FIGS. 9A and 9B illustrate an application of the method in FIG. 1 to a welded structure 900. In the welded structure 900, damage accumulation spatial and over time may play an important role due to presence of residual stress. Residual stress from welding acts as mean stress on the welded structure 900. Further, when the welded structure 900 is subjected to multi axial loading, spatial-damage accumulation and time-damage accumulation may change at each cycle. FIGS. 9A and 9B illustrate different cycles.

FIG. 9A illustrates a first cycle with a perpendicular damage scenario. In FIG. 9A, load 910 on the welded structure 900 is experienced perpendicular to weld region 902. FIG. 9B illustrates a second cycle with aligned damage scenario. In FIG. 9B, load 820 on the welded structure 900 is experienced along the weld region 902. Through the method disclosed herein, the time-damage accumulation for the welded structure 900 is determined as a function of the first cycle and second cycle. Further, the spatial-damage accumulation associated with regions in the welded structure 900 is determined. Accordingly, the method disclosed herein is suitable to determine fatigue life of a component that is subject to multi axial loading. Application of the method may be extended to components that experience unexpected changes in operating conditions. Example changes include erosion, Foreign Object Damage (FOD), etc.

It is to be understood that the elements and features recited in the appended claims may be combined in different ways to produce new claims that likewise fall within the scope of the present disclosure. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

While the present disclosure has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A method for estimation of fatigue life of a technical system, wherein the technical system comprises of a plurality of components, the method comprising:

computing a lifing probability distribution for at least one component of the plurality of components of the technical system based on material property scatter data and damage scenarios associated with the at least one component, wherein the damage scenarios refer to operating conditions of the technical system in which the at least one component may be damaged;

determining a time-damage accumulation for the at least one component by combining the damage scenarios and damage accumulation rules for the at least one component with respect to a time dimension, wherein the damage accumulation rules are rules associated with physics and an operation profile of the technical system and the at least one component;

determining a spatial-damage accumulation for each region of a plurality of regions in the at least one component with respect to a space dimension based on a probability distribution with respect to spatial damage-events in time and the damage scenarios, wherein the spatial damage-events are events associated with each region of the plurality of regions in the at least one component that lead to damage of the at least one component;

determining a cumulative time-damage accumulation for each region of the plurality of regions in the at least one component, wherein the cumulative time-damage accumulation is an integral of the time-damage accumulation for a number of cycles of a cyclic load on the at least one component for each region of the plurality of regions;

determining an integral damage that comprises an integral of the spatial-damage accumulation and the cumulative time-damage accumulation over a period of time for the at least one component based on a simulation of the damage scenarios and conditional probabilities for the damage scenarios; and estimating fatigue life of the technical system by determining a probability of fatigue failure of the technical system by combining the integral damage and predicted damage scenarios for the plurality of components, wherein the predicted damage scenarios refer to simulations of damage scenarios for each component of the plurality of components.

2. The method of claim 1, wherein the estimating of the fatigue life of the technical system comprises:
estimating component-fatigue life of the at least one component by determining a component-probability of failure by combining the integral of the spatial-damage accumulation and the cumulative time-damage accumulation for the at least one component.

3. The method of claim 1, wherein the probability of fatigue failure of the technical system is determined by:
applying a law of total probability to the predicted damage scenarios and to a component-probability of failure based on:

$$F^{total} = \sum_q F(n)[q] * P[q]$$

wherein:
$F^{total}$ is the probability of fatigue failure of the technical system,
q represents a numerical random simulation of the damage scenarios,
F(n) [q] is the component-probability of failure for the numerical random simulation of the damage scenarios, and
P [q] is a probability of the numerical random simulation of the damage scenarios.

4. The method of claim 3, wherein the component-probability of failure for the numerical random simulation of the at least one damage scenario (F(n)[q]) is determined as:

$$F(n)[q] = 1 - \exp\left(-\left(\frac{n}{\eta(n)}\right)^m\right)$$

where n is a cycle number of the cyclic loads, and wherein:

$$\eta(n) = \int_A ((D(n, x))^m dA)^{-1/m}$$

wherein:
η(n) is a function of the cycles for the spatial-damage accumulation and the time-damage accumulation,
D(n,x) is a function of the time-damage accumulation, and
m is a material parameter of the at least one component with surface A.

5. The method of claim 4, wherein D(n,x) is determined as:

$$D(n, x) = \sum_{j=1}^{d} \frac{q_j(n, x)}{n_{jdet}(x)}$$

wherein $q_j(n,x)$ is a contribution of damage scenario (j) of the damage scenarios until cycle n of the cyclic load for each region of the plurality of regions (x) on the at least one component, and
wherein $n_{jdet}(x)$ is a fatigue crack initiation time for the damage scenario (j).

6. The method of claim 1, wherein the technical system is at least one blade of a turbine,
wherein the at least one blade comprises a thermal barrier coating (TBC) and blade base material,
wherein the method estimates a blade-fatigue life of the blade based material on a TBC probability of failure, and
wherein the TBC probability of failure is a probability of failure of the TBC.

7. The method of claim 6, further comprising:
computing a blade-lifing probability distribution for the blade base material based on material property scatter data of the blade base material and at least one TBC damage scenario, wherein the at least one TBC damage scenario is one scenario of a plurality of TBC damage scenarios associated with one of presence and absence of the TBC on a plurality of blade regions of the blade base material;
determining a time-damage accumulation for the blade base material by combining the plurality of TBC damage scenarios and damage accumulation rules for the at least one blade;
determining a spatial-damage accumulation for the plurality of blade regions for the at least one TBC damage scenario by combining integrated time-damage accumulation;
integrating the spatial-damage accumulation for the blade base material based on a numerical random simulation of the at least one TBC damage scenario and conditional probabilities; and
estimating fatigue life of the at least one blade by determining a probability of fatigue failure of the at least one blade.

8. The method of claim 7, wherein the conditional probabilities are determined by:
determining a TBC life for the TBC based on the TBC probability of failure, wherein the TBC probability of failure is determined based on TBC material property scatter data, physics, and an operation profile of the at least one blade;
determining a cycle number at an instant based on the TBC life for the at least one TBC damage scenario; and
determining a conditional damage for the at least one TBC damage scenario.

9. The method of claim 7, further comprising:
generating a blade model of the at least one blade based on a blade geometry, physics, and an operation profile of the at least one blade; and
simulating the at least one TBC damage scenario on the blade model.

10. The method of claim 1, wherein the technical system is a rotor of a turbine,
wherein the rotor comprises a plurality of rotor regions,
wherein the method estimates a rotor-fatigue life of the rotor based on a probability of failure for a plurality of rotor-damage scenarios, and
wherein the rotor-damage scenarios are due to physics and an operation profile of the rotor.

11. The method of claim 10, further comprising:
determining a time-damage accumulation for each region of the plurality of rotor regions by combining the plurality of rotor-damage scenarios and damage accumulation rules for the rotor;
determining a spatial-damage accumulation for the plurality of rotor regions for the plurality of rotor-damage scenarios by determining a cumulative time-damage accumulation for each region of the plurality of rotor regions over number of cycles, wherein n is a number of the cyclic load applied on the rotor;
integrating the spatial-damage accumulation for the rotor based on probability of fatigue failure for each rotor-damage scenario of the plurality of rotor-damage scenarios; and
estimating fatigue life of the rotor by determining the probability of failure of the rotor based on the spatial-damage accumulation and the time-damage accumulation.

12. A device for estimating fatigue life of a technical system subject to at least one cyclic load, wherein the technical system comprises of a plurality of components including at least one component, the device comprising:
at least one processor; and
a memory communicatively coupled to the at least one processor, the memory comprising:
a material module configured to compute a lifing probability distribution for the at least one component based on material property scatter data and damage scenarios associated with the at least one component, wherein the damage scenarios refer to operating conditions of the technical system in which the at least one component may be damaged;
a time module configured to determine a time-damage accumulation for the at least one component by combining the damage scenarios and damage accumulation rules for the at least one component with respect to a time dimension, wherein the damage accumulation rules are rules associated with physics and an operation profile of the technical system and the at least one component;
a space module configured to determine a spatial-damage accumulation for each region of a plurality of regions in the at least one component with respect to a space dimension based on a probability distribution with respect to spatial damage-events in time and the damage scenarios, wherein the spatial damage-events are events associated with each region of the plurality of regions in the at least one component that lead to damage of the at least one component, wherein the space module is further configured to determine a cumulative time-damage accumulation for each region of the plurality of regions in the at least one component, and wherein the cumulative time-damage accumulation is an integral of the time-damage accumulation for a number of cycles of a cyclic load on the at least one component for each region of the plurality of regions;
a damage module configured to determine an integral damage that comprises an integral of the spatial-damage accumulation over a period of time and the cumulative time-damage accumulation for the at least one component based on a simulation of the damage scenarios and conditional probabilities for the damage scenarios; and
a life module configured to estimate fatigue life of the technical system by determining a probability of fatigue failure of the technical system by combining the integral damage for the plurality of components.

13. The device of claim 12, wherein the device is communicatively coupled to the technical system whereby the fatigue life of the technical system is estimated at an arbitrary instant.

14. A system for a technical plant, the technical plant comprising a plurality of technical systems, each subject to cyclic loads comprising at least one component, the system comprising:
a server operable on one of a cloud computing platform and an edge computing platform;
a network interface communicatively coupled to the server;
a device for each system of the technical systems, the device comprising:
a material module configured to compute a lifing probability distribution for the at least one component based on material property scatter data and damage scenarios associated with the at least one component, wherein the damage scenarios refer to operating conditions of the technical system in which the at least one component may be damaged;
a time module configured to determine a time-damage accumulation for the at least one component by combining the damage scenarios and damage accumulation rules for the at least one component with respect to a time dimension, wherein the damage accumulation rules are rules associated with physics and an operation profile of the technical system and the at least one component;
a space module configured to determine a spatial-damage accumulation and a cumulative time-damage accumulation for each region of a plurality of regions in the at least one component;
a space module configured to determine a spatial-damage accumulation for each region of a plurality of regions in the at least one component with respect to a space dimension based on a probability distribution with respect to spatial damage-events in time and the damage scenarios, wherein the spatial damage-events are events associated with each region of the plurality of regions in the at least one component that lead to damage of the at least one component, wherein the space module is further configured to determine a cumulative time-damage accumulation for each region of the plurality of regions in the at least one component, and wherein the cumulative time-damage accumulation is an integral of the time-damage accumulation for a number of cycles of a cyclic load on the at least one component for each region of the plurality of regions;
a damage module configured to determine an integral damage that comprises an integral of the spatial-damage accumulation over a period of time and the cumulative time-damage accumulation for the at least one component based on a simulation of the damage scenarios and conditional probabilities for the damage scenarios; and
a life module configured to estimate fatigue life of the technical system by determining a probability of fatigue failure of the technical system by combining the integral damage for a plurality of components.

15. The system of claim 14, wherein the server comprises:
a processing unit communicatively coupled to a communication unit; and
a memory unit communicatively coupled to the processing unit and the communication unit, the memory unit comprising the material module, the time module, the space module, the damage module, and the life module.

16. The system of claim 14, further comprising:
a communication unit capable of communicating with the server; and
a database communicatively coupled to the server, the database comprising:
a model generator module configured to generate system models of the technical systems based on system geometry and boundary conditions of the technical systems, wherein the system geometry includes component geometry associated with components of the technical systems and material geometry associated with the at least one component, wherein the boundary conditions include physics based boundary conditions of the technical systems.

* * * * *